US005949897A

United States Patent [19]
Bartels et al.

[11] Patent Number: 5,949,897
[45] **Date of Patent: *Sep. 7, 1999**

[54] SOUND REPRODUCTION DEVICE WITH ACTIVE NOISE COMPENSATION

[75] Inventors: Volker Bartels, Hannover; Burkhard Markmann, Seelze, both of Germany

[73] Assignee: Sennheiser electronic KG, Wedemark, Germany

[ * ] Notice: This patent is subject to a terminal disclaimer.

[21] Appl. No.: 09/033,254

[22] Filed: Mar. 2, 1998

Related U.S. Application Data

[63] Continuation of application No. 08/560,861, Nov. 20, 1995, Pat. No. 5,809,156.

[30] Foreign Application Priority Data

Jul. 19, 1995 [DE] Germany ........................... 195 26 124

[51] Int. Cl.[6] ............................ H04R 25/00; H03B 29/00
[52] U.S. Cl. ......................... 381/372; 381/71.1; 381/71.7
[58] Field of Search .................................... 381/355, 356, 381/358, 361, 370, 371, 372, 373, 374, 375, 71.1, 71.7, 71.14, 72, 93, 94.1

[56] References Cited

U.S. PATENT DOCUMENTS

| | | | |
|---|---|---|---|
| 4,058,688 | 11/1977 | Nishimura et al. | 381/372 |
| 4,239,945 | 12/1980 | Atoji et al. | 381/371 |
| 4,658,931 | 4/1987 | Curry | 381/372 |
| 4,742,887 | 5/1988 | Yamagishi | 381/372 |
| 5,148,887 | 9/1992 | Murphy | 381/372 |
| 5,181,252 | 1/1993 | Sapiejewski et al. . | |
| 5,182,774 | 1/1993 | Bourk | 381/372 |
| 5,208,868 | 5/1993 | Sapiejewski | 381/372 |
| 5,305,387 | 4/1994 | Sapiejewski | 381/372 |
| 5,343,523 | 8/1994 | Bartlett et al. | 381/72 |
| 5,492,129 | 2/1996 | Greenberger | 128/715 |
| 5,757,946 | 5/1998 | Schyndel | 381/412 |

FOREIGN PATENT DOCUMENTS

| | | |
|---|---|---|
| 0425129 | 5/1991 | European Pat. Off. . |
| 2500397 | 7/1976 | Germany . |
| 3706481 | 9/1987 | Germany . |

*Primary Examiner*—Curtis A. Kuntz
*Assistant Examiner*—Rexford N Barnie
*Attorney, Agent, or Firm*—McAulay Nissen Goldberg Kiel & Hand, LLP

[57] ABSTRACT

A sound reproduction device such as a headphone with active noise compensation has a housing and a transducer for converting electrical signals to sound waves is disposed within the housing. The transducer has a diaphragm for separating the volume ($V_2$) in front of the diaphragm from the volume ($V_1$) to the rear of the diaphragm. The transducer diaphragm and rear volume ($V_1$) have a determined compliance. The sound reproduction device includes active noise compensation components for reducing unwanted noise at the output of the transducer. The diaphragm has a compliance ($N_M$) which is less than the compliance ($N_1$) of the rear volume ($V_1$). The diaphragm is preferably constructed from a plurality of layers. In a further preferred arrangement, a damping element is disposed very close to the rear side of the diaphragm. A preferred construction for optimizing the voice coil is described. In an active noise compensation construction employing a microphone having a central axis for picking up noise, a preferred arrangement orients the central microphone axis at an angle of about 45° relative to the central axis of the transducer.

11 Claims, 4 Drawing Sheets

SOUND REPRODUCTION DEVICE WITH ACTIVE NOISE COMPENSATION

This application is a continuation of Ser. No. 08/560,861 filed Nov. 20, 1995 now U.S. Pat. No. 5,809,156.

BACKGROUND OF THE INVENTION a) Field of the Invention

The present invention relates to improvements in sound reproduction devices and, in particular, in such devices having active noise compensation, b) Description of the Related Art Noise is one of the most severe environmental pollutants and is a stress factor to be taken seriously. Studies have shown that noise acts on the vegetative nervous system, resulting in fatigue, loss of concentration, nervousness, and irritability. Further, continuous effects of noise lead to permanent hearing loss.

In order to combat these problems, sound reproduction devices with active noise compensation based on the principle of phase-inverted sound are already known.

For this purpose, the sound wave occurring at the site of influence, e.g., the ear, is fed at this location to a filter by means of an acoustic pickup in the form of a microphone for a phase shift of 180° and the phase-inverted sound is emitted via a transducer.

A noise reduction of more than 15 dB can be achieved in the low frequency range with an active noise compensation device of this kind in combination with passive hearing protection or closed headphones. A noise reduction of 10 dB is perceived subjectively as a 50% reduction in loudness.

Such headphones with active noise compensation have been commercially available for some years, e.g., under the trade name "NoiseGard®" (trademark of Sennheiser electronic KG), model HDC 200 "NoiseGard® mobile". The principle of active noise compensation is also known, for example, from the following references: DE-A-95134, DE-B-305391, DE-C-71754, DE-C-71534, DE-C-655508, DE-A-3719963, DE-C-40153, DE-U-881597, EP-A-008389, GB-A-147166, GB-A-16074, GB-A-160070, GB-A-09769, GB-C-1530814, DE-A-33498, DE-A-3137747, DE-151717, EP-A-0461801, U.S. Pat. No. 4,736,431, U.S. Pat. No. 4,622,692, U.S. Pat. No. 4,494,074, U.S. Pat. No. 4,05,734, U.S. Pat. No. 4,017,797, U.S. Pat. No. 3,952,158, U.S. Pat. No. 3,637,040, U.S. Pat. No. 2,972,018 or U.S. Pat. No. 3,043,416, GB-2,187,361, U.S. Pat. No. 3,637,040, U.S. Pat. No. 4,922,542, U.S. Pat. No. 4,399,334, US-RE-260,030, and U.S. Pat. No. 1,807,225.

Finally, a high compliance headphone transducer used for an active noise compensation device is known from U.S. Pat. No. 5,181,252. In this known device, the cavity in front of the transducer is separated from the closed cavity to the rear of the transducer by the transducer membrane or diaphragm. Further, the transducer has a diaphragm which is considerably more compliant than the rear cavity volume or, in other words, the rear volume is appreciably stiffer than the stiffness of the diaphragm of the transducer. Such a ratio of diaphragm stiffness to the stiffness of the rear volume is achieved, e.g., in a transducer diaphragm formed of a polycarbonate film having a thickness of 40 $\mu$m. In the noise compensation device known from U.S. Pat. No. 5,181,252, the rear volume accordingly determines the total stiffness of the arrangement comprising the transducer and rear volume. A known device of this kind has a relatively low resonance frequency and is less mechanically robust relative to environmental influences such as pressure and temperature fluctuations. As a result, the transducer is exposed to the risk of mechanical damage especially when the active noise compensation device is used under extreme environmental conditions, as is not uncommon in air traffic.

OBJECT AND SUMMARY OF THE INVENTION

The primary object of the present invention is to improve the transducer for a noise compensation device while avoiding the disadvantages of the prior art.

In accordance with the invention, this object is met by an electroacoustic device with active noise compensation components which has a transducer having a transducer diaphragm which separates the volume in front of the diaphragm from the volume to the rear of the diaphragm and in which the transducer diaphragm is stiffer than the rear volume (i.e., the diaphragm compliance is less than the compliance of the rear volume).

Although the resonance frequency of the system increases when the diaphragm compliance, according to the invention, is less than the compliance of the rear volume, i.e., when the diaphragm is stiffer than the volume to its rear, this does not have a negative impact on the overall system and can be compensated for by other steps. However, as a result of the steps according to the invention, the response of the transducer overall is determined more by its own diaphragm than by the volume to its rear. Accordingly, the electroacoustic sensitivity of the transducer is reduced, but in particular the transducer has a greater mechanical robustness with respect to environmental influences such as fluctuations in pressure and temperature and is accordingly better suited for use under extreme conditions. As a result of the steps according to the invention, the active noise compensation function, as such, remains extensively unchanged and as a result of the higher resonance of the system, the range is also expanded without feedback-critical phase shifts.

One possibility for stiffening the diaphragm is to construct the diaphragm from successive laminated films, preferably from three, namely 60 $\mu$m polycarbonate, followed by a film of 30 $\mu$m polyurethane and another 60 $\mu$m film of polycarbonate.

For the rest, it is very advantageous to provide a damping resistor under the diaphragm to damp the fundamental resonance of the diaphragm. This can be effected primarily by arranging damping means below and very close to the diaphragm so that the volume between the surround region of the diaphragm is reduced in proportion to the rear volume.

Although the transducer is less sensitive at first as a result of the steps according to the invention, the sensitivity can be increased again to the desired extent by optimizing the voice coil. This can be suitably accomplished by maximizing the product of specific conductivity and cross-sectional area of the wire of the transducer coil.

BRIEF DESCRIPTION OF THE DRAWINGS

The invention will be explained more fully in the following with reference to an embodiment example shown in the drawings, in which.

DESCRIPTION OF THE PREFERRED EMBODIMENTS

Figure 1:
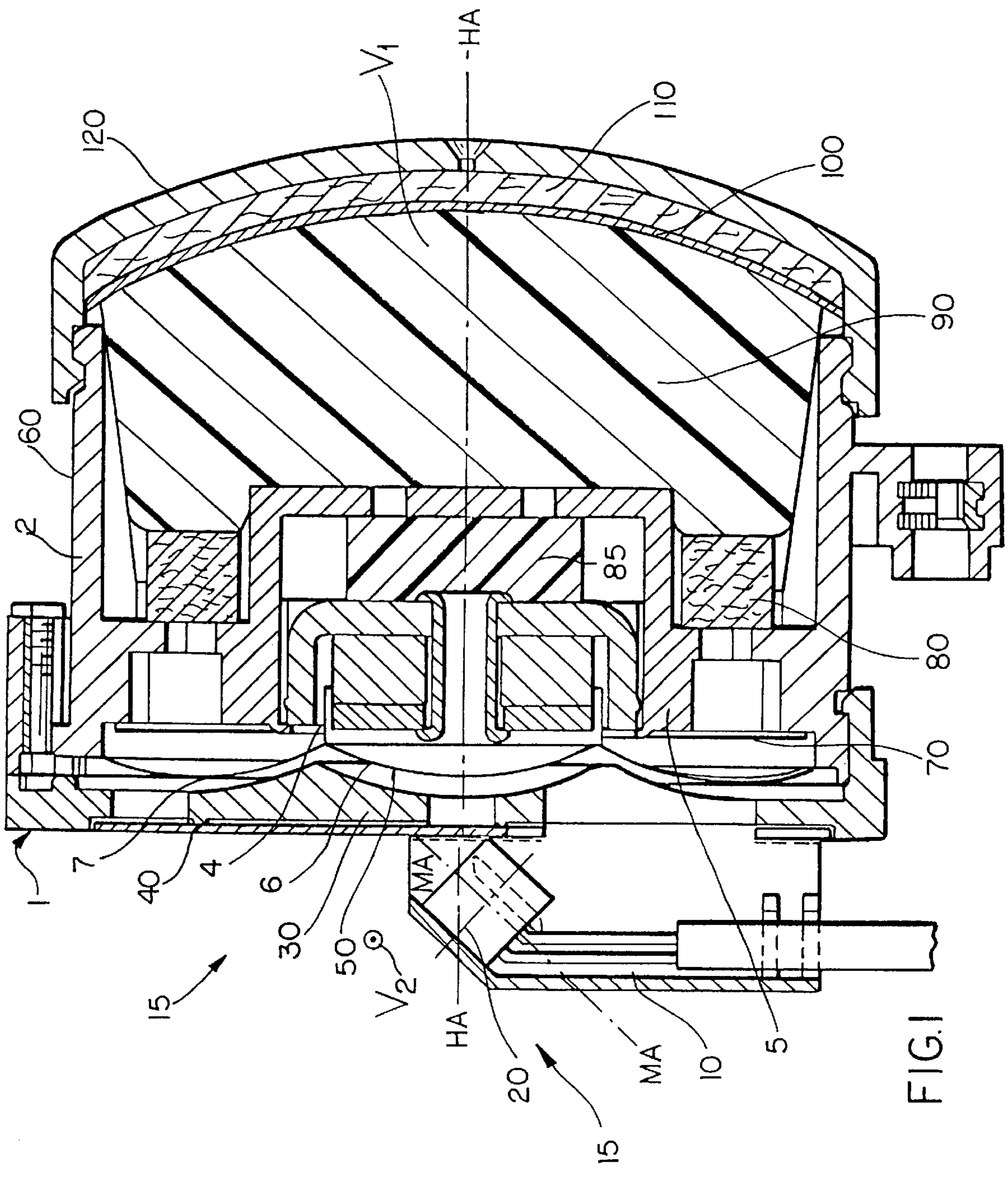
FIG. 1 shows a cross section through a headphone transducer with active noise compensation according to the invention.

FIG. 1 shows a section through a headphone with active noise compensation according to the invention. The headphone has a transducer 1 with a transducer housing 2 and a transducer diaphragm 50, a coil 4 attached to the rear portion of the diaphragm, and a coil housing 5. The transducer diaphragm 50 is formed of a central part 6—known as a dome—and a ring 7 surrounding the dome—known as a surround—for generating sound. The surround also serves as a mechanical suspension for the dome and ensures the displaceability of the dome 6 and the coil 4 which is attached to the latter and penetrates into the coil housing 5 depending on a noise compensation current. The transducer housing 2 is formed of three interconnected parts, namely a resonator 30 which is attached to a chassis 60, and a cover 120 and protective cap which are arranged on the rear of the chassis 60.

The transducer diaphragm 50 separates the volume $V_1$ to the rear of the diaphragm 50 from the volume $V_2$ in front of the diaphragm. The rear volume $V_1$ is completely closed off by the closed transducer housing, while the front volume $V_2$ is that situated between the transducer diaphragm 50 and the human ear and differs due to the various physiognomic forms of the human ear and human auditory canal. In every instance, the front volume $V_2$ is greater by a multiple than the rear volume $V_1$.

A resonator 30 which is preferably formed of plastic is provided in front of the diaphragm for mechanical protection of the transducer diaphragm and an acoustically transparent cloth 40 is provided across from the resonator 30 as damping means, principally so as to prevent dust from penetrating into the region of the diaphragm of the transducer.

Various damping means are arranged in the rear volume in order to reduce the fundamental resonance of the transducer. A damping disk 70 formed from acoustic silk is located below the surround at an average distance of about 2 mm from the latter as first damping means. Further, a damping felt ring 80 is provided in the middle portion of the rear volume at the transition to the surround region and an acoustically transparent foam 90, a paper layer 100 and a damping felt 110 are arranged between the damping felt ring 80 and a protective cap 120 of the transducer housing 2. Further, a tubular rivet 101 is provided below the dome to hold together the coil magnet 102 of the moving coil or voice coil 5 and an acoustically open foam 85 for damping the tubular rivet. Further, the transducer has a microphone holder 10 which is supported externally at the front and holds a microphone whose main axis MA is inclined at an angle of approximately 45° relative to the main axis HA of the transducer. In the region below the microphone, the mechanical fabric protection 40 is omitted and the resonator 30 is drilled through.

The microphone picks up the noise 15 in front of the transducer and transforms it into a corresponding electric signal which is transmitted to a circuit generating a transducer signal with a 180° phase shift which is fed to the coil 4 to produce a corresponding deflection of the voice coil 4.

Figure 2A:
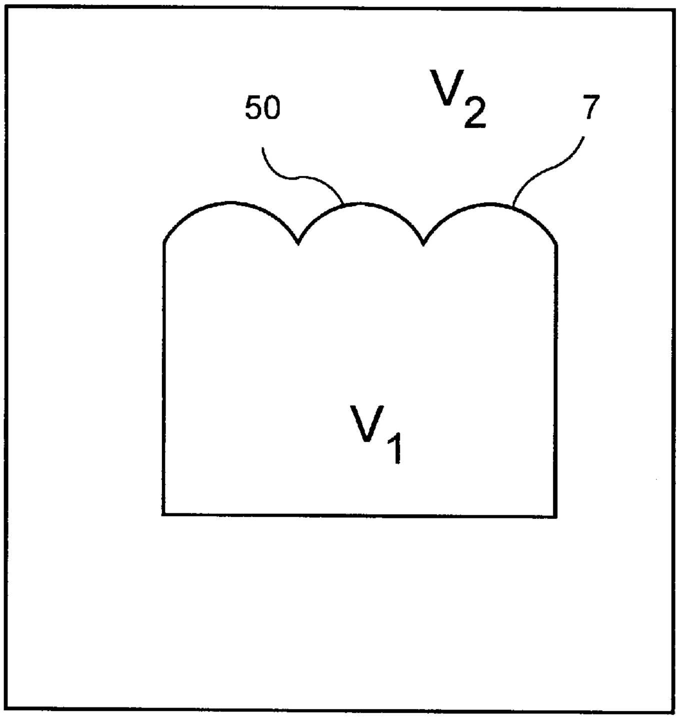
FIG. 2 shows an acoustic equivalent circuit diagram for the transducer according to FIG. 1.
Figure 2B:
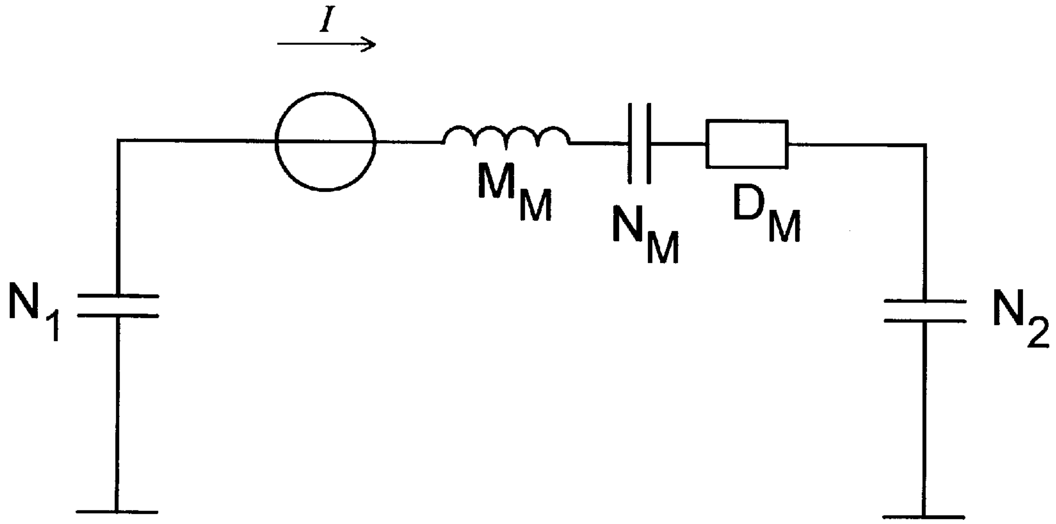

FIG. 2 shows a simplified acoustic equivalent circuit diagram for the arrangement of the transducer according to FIG. 1. The following notation is used in the equivalent circuit diagram:

$V_1$ rear volume
$V_2$ front volume
$N_1$ compliance of the volume to the rear of the diaphragm
$N_2$ compliance of the volume in front of the diaphragm
$M_M$ diaphragm mass
$N_M$ diaphragm compliance
$D_M$ mechanical damping of diaphragm
$\omega_0, \omega''_0$, resonance frequencies$=2\pi f_0$ and $2\pi f_0''$ If the headphones are not being worn, the volume $V_2$ in front of the diaphragm is very large and for the sake of simplicity $N \rightarrow \infty$ will be assumed in the following and is therefore not taken into account.

For the equivalent circuit diagram shown in FIG. 2, the ratio to be found is $N_M$: $N_1=\epsilon$.

If $\epsilon<1$, that is, $N_M<N_1$, the diaphragm is stiffer than the rear volume;

If $\epsilon=1$, that is, $N_M=N_1$, the diaphragm and the rear volume are equally stiff;

If $\epsilon>1$, that is, $N_M>N_1$, the diaphragm is more compliant than the rear volume. The latter case is described in U.S. Pat. No. 5,181,252, where the overall stiffness of the transducer is determined by the rear volume.

Without the rear volume $V_1$ ($V_1 \rightarrow \infty$), the following equation is true for the equivalent circuit diagram in FIG. 2:

$$\omega_0 = \sqrt{\frac{1}{M_M \cdot N_M}} \tag{1}$$

With rear volume $V_1$ ($N_1 \neq \infty$), the following is true:

$$\omega_0' = \sqrt{\frac{1}{M_M \cdot N'}} \tag{2}$$

where $$N' = \frac{N_M \cdot N_1}{N_M + N_1} \tag{3}$$

so that $$\omega'_0 = \sqrt{\frac{N_M + N_1}{M_M \cdot N_M \cdot N_1}} \tag{4}$$

This transforms to:

$$\omega_0^2 \cdot N_M = \omega_0'^2 \cdot \frac{N_M \cdot N_1}{N_M + N_1} \tag{5}$$

Equating equations (1) and (4) by $$\frac{1}{M_M}$$

gives $$\frac{f_0^2}{f_0'^2} \cdot N_M = \frac{N_M \cdot N_1}{N_M + N_1} \tag{6}$$

Further transformation gives:

$$N_M + N_1 = N_1 \frac{f_0'^2}{f_0^2} \tag{7}$$

that is, $$N_M = N_1\left(\frac{f_0'^2}{f_0^2} - 1\right) \tag{8}$$

and, finally:

$$\frac{N_M}{N_1} = \left(\frac{f_0'^2}{f_0^2} - 1\right) = \epsilon \tag{9}$$

If single-layer diaphragms formed of a polycarbonate film with a thickness of 40 μm had been used, then:

$$f_0 = 180 \text{ Hz};\ f'_0 = 790 \text{ Hz, accordinglyand thus } \epsilon = \frac{790^2}{180^2} - 1 = 18.3;$$

that is, the diaphragm is more compliant than the volume to the rear of the diaphragm by a factor of 18.3 and the volume to the rear of the diaphragm is stiffer than the diaphragm by a factor of 18.3.

Diaphragms with layers of different thickness, e.g., a diaphragm foil formed of three films with 60 μm polycarbonate, 30 μm polyurethane, 60 μm polycarbonate, are suitable for reducing $\epsilon$ below 1.

$$f_0 = 675 \text{ Hz};\ f'_0 = 918 \text{ Hz, accordingly } \epsilon = \frac{918^2}{675^2} - 1 = 0.85;$$

that is, $$N_M = 0.85 \cdot N_1 \tag{10}$$

That is, the diaphragm is now stiffer than the volume $V_1$ to its rear. The advantage in constructing the diaphragm from different layers consists in that the inner damping of the diaphragm is greater than that in a single-layer diaphragm so that natural resonance is prevented.

It should be noted that the resonance frequency was measured in a diaphragm without damping, i.e., without damping of the surround. The resonance frequencies shift toward lower values when measured with damping. This results in an increase in $\epsilon$, which naturally does not signify any change in the relative stiffness ratios. Rather, the equivalent circuit diagram according to FIG. 2 no longer applies.

FIG. 3 shows different sound pressure frequency diagrams which show the ratios resulting when various measures are implemented. FIG. 3*a* shows a sound pressure frequency diagram of a known noise compensation transducer—see FIG. 4—having a resonance frequency $f_0$, a sound pressure sensitivity $P_{01}$, below the resonance frequency, and a sound pressure sensitivity $P_{02}$ above the resonance frequency.

Figure 3A:
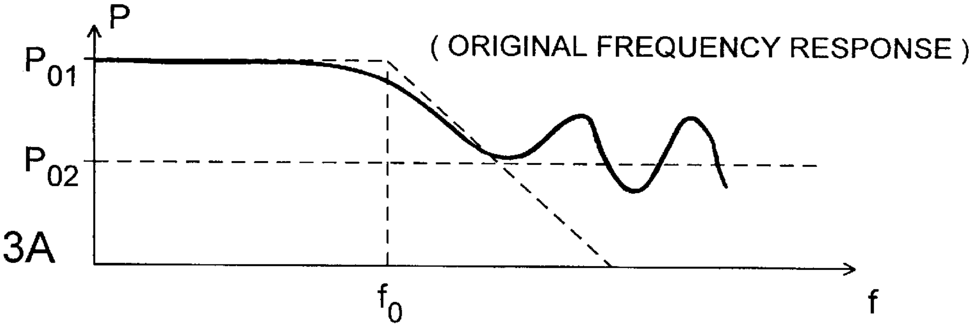
FIG. 3 shows sound pressure frequency diagrams for various effects of features in the transducer according to FIGS. 1 and 2.
Figure 3B:
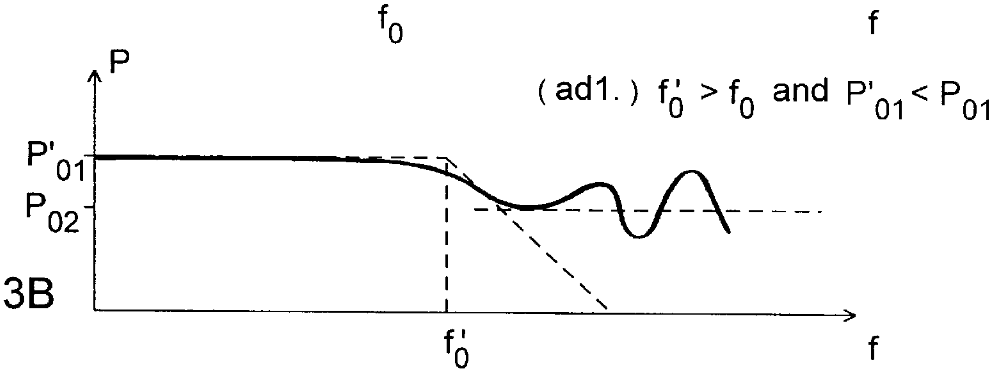
Figure 3C:
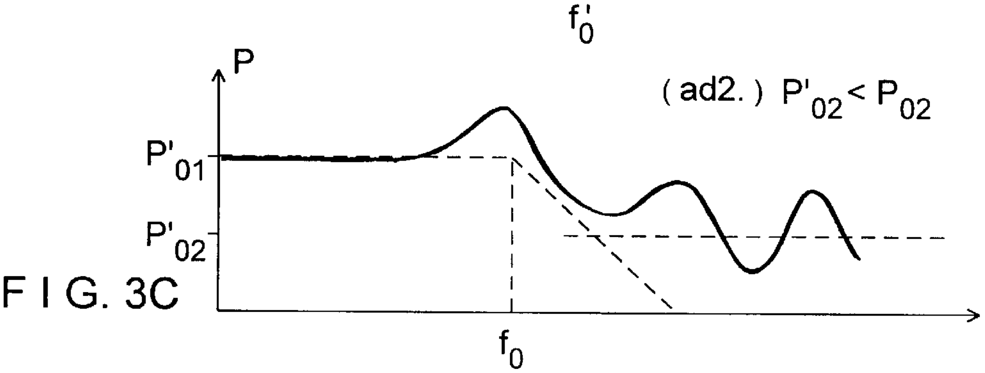
Figure 3D:
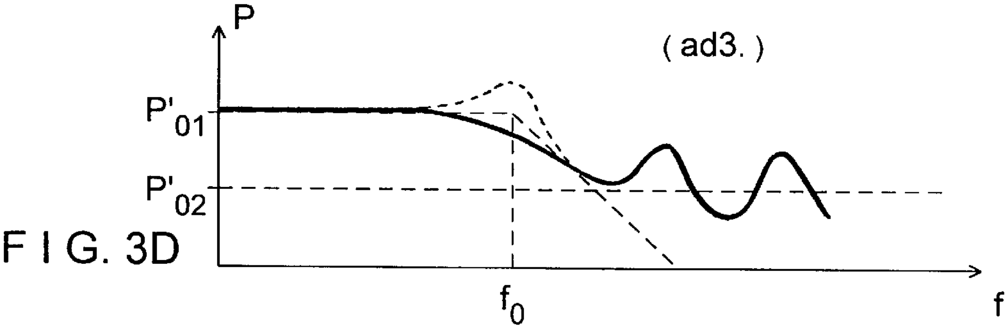

If the diaphragm flexibility $N_M$ is less than the flexibility $N_1$of the rear volume $V_1$, that is, $\epsilon<1$, as proposed according to the invention, the resonance frequency increases to $f_{0''}$and $P_{01''}$, that is, the sensitivity below the resonance frequency decreases below $P_{01}$ as is shown in FIG. 3*b*. If the dynamic mass of the transducer increases—see FIG. 3*c*—the resonance frequency decreases to the former value, but the fundamental resonance is elevated to a marked degree and the sensitivity above the resonance frequency decreases, i.e., $P_{02''}<P_{02}$.

In order to damp the fundamental resonance, the damping resistance below the diaphragm can be increased. The best method for carrying this out consists in arranging the first damping means in the form of the acoustic silk below the surround relatively close thereto so that the desired ratios—FIG. 3*d*—are restored, but the diaphragm as a whole has an increased robustness and is accordingly better suited for use under extreme conditions.

The preceding discussion shows that an increase in the stiffness of the diaphragm, so that $\epsilon<1$, increases the resonance frequency of the transducer system and at the same time reduces the sensitivity below the resonance frequency. The resonance frequency of the transducer system is determined by the mass of the system comprising the diaphragm and voice coil and by its flexural rigidity. The resonance frequency can be set at the desired value by means of the dynamic mass of the transducer system. An increase in the dynamic mass of the transducer system leads to a reduction in the resonance frequency. This results in a marked elevation in the fundamental resonance of the transducer system and a decrease in sensitivity above the resonance frequency.

For the purpose of damping the fundamental resonance, the damping resistance below the diaphragm can be increased. This can be effected by means of the damping disk 70 below the surround 7 as is shown in FIG. 1.

Figure 3E:
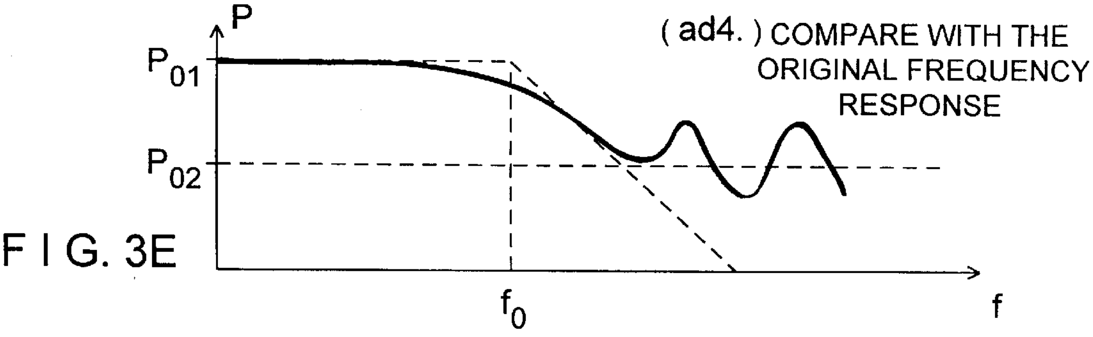

Finally, by optimizing the voice coil 4, the sensitivity below and above the resonance frequency can be adjusted to the required value—FIG. 3*e*.

In this respect the following observations may be made. The following equation is given for the excursion or deflection force of the transducer (magnet/coil):

$$F = (B \cdot l) \cdot I \tag{11}$$

where B represents the magnetic induction, l represents the wire length in the magnetic field, and I represents the voice current or coil current. Transforming this equation gives:

$$F = (B \cdot l) \cdot \frac{U}{R} \tag{12}$$

where U is the source voltage and R is the wire resistance.
where U is the source voltage and R is the wire resistance.

Further transformation gives:

$$F = (B \cdot l) \cdot \frac{U \cdot A \cdot \sigma}{l} = B \cdot U \cdot \sigma \cdot A$$

where σ corresponds to the specific conductivity of the coil and A corresponds to the cross-sectional area of the coil wire.

Since B and U cannot be influenced in practice, the sensitivity of the coil and accordingly the sensitivity of the entire transducer can be adjusted to the required value by maximizing the term $\sigma \cdot A$.

Figure 4:
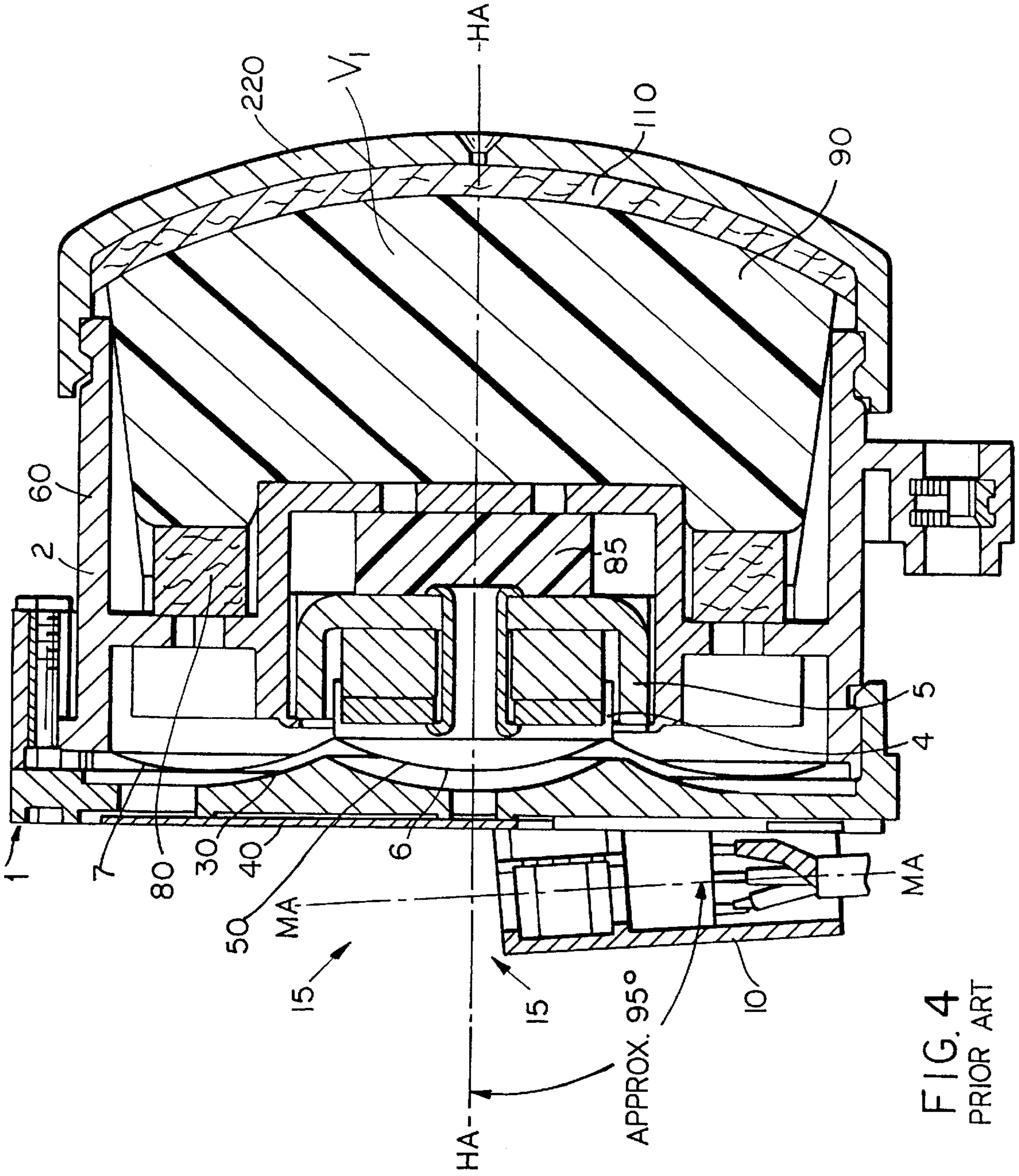
FIG. 4 PRIOR ART
FIG. 4 shows a cross section through a known headphone with active noise compensation.

FIG. 4 shows a transducer arrangement of the type which has been commercially available for a number of years. Parts of the transducer in FIG. 4 which are identical to those shown in FIG. 1 are provided with the same reference numbers. The differences in design between the known transducer shown in FIG. 4 and the transducer shown in FIG. 1 will be apparent to the person skilled in the art. The substantial differences consist in the arrangement of the microphone relative to the main axis HA of the transducer, the damping below the surround 7, and the construction of the diaphragm 50 which is formed of a polycarbonate film with a thickness of 40 μm in the known transducer.

While the foregoing description and drawings represent the preferred embodiments of the present invention, it will be obvious to those skilled in the art that various changes and modifications may be made therein without departing from the true spirit and scope of the present invention.

What is claimed is:

1. In an electroacoustical device with active noise compensation components, comprising:

a transducer having a transducer diaphragm which separates a volume ($V_2$) in front of the diaphragm from a volume ($V_1$) to the rear of the diaphragm, said transducer diaphragm and rear volume ($V_1$) have a determined compliance, the diaphragm compliance ($N_M$) being less than the compliance ($N_1$) of the rear volume ($V_1$).

2. The device according to claim 1, wherein the diaphragm is formed from a plurality of layers.

3. The device according to claim 2, wherein the diaphragm is formed of three laminated layers, the first and third comprising polycarbonate and the second comprising polyurethane.

4. The device according to claim 1 wherein damping means comprising a damping disk of acoustic silk are arranged very close to the rear side of the diaphragm.

5. The device according to claim 1, wherein the transducer has a voice coil provided with a wire with a cross-sectional area and a specific conductivity, and wherein the product of the cross-sectional area of the wire and the specific conductivity of the wire is maximized.

6. A method of using a transducer for an electroacoustical device with active noise compensation, said transducer having a diaphragm, comprising the steps of:

placing said diaphragm so as to separate a volume ($V_2$) in front of the diaphragm from a volume ($V_1$) to the rear of the diaphragm, the transducer diaphragm and the rear volume ($V_1$) having a determined compliance; and providing that the diaphragm compliance ($N_M$) be less than the compliance ($N_1$) of the rear volume ($V_1$).

7. In a headphone for sound reproduction having a housing, a transducer for converting electrical signals to sound waves being disposed within said housing, said transducer having a diaphragm for separating the volume ($V_2$) in front of the diaphragm from the volume ($V_1$) to the rear of the diaphragm, said transducer diaphragm and the rear volume ($V_1$) having a predetermined compliance, and including an active noise compensation device for reducing unwanted noise at the output of said transducer, the improvement comprising that said diaphragm compliance ($N_M$) is less than compliance ($N_1$) of the rear volume ($V_1$).

8. The headphone according to claim 7, wherein the diaphragm is formed from a plurality of layers.

9. The headphone according to claim 7, wherein the diaphragm is formed of three laminated layers, the first and third comprising polycarbonate and the second comprising polyurethane.

10. The device according to claim 11 wherein damping means comprising a damping disk of acoustic silk are arranged very close to the rear side of the diaphragm.

11. The headphone according to claim 7, wherein the transducer has a voice coil provided with a wire with a cross-sectional area and a specific conductivity, and wherein the product of the cross-sectional area of the wire and the specific conductivity of the wire is maximized.

* * * * *